United States Patent
Tanaka et al.

(10) Patent No.: US 9,446,477 B2
(45) Date of Patent: Sep. 20, 2016

(54) BONDING HEAD

(71) Applicants: Eiji Tanaka, Kanazawa (JP); Hiroyuki Yasuyoshi, Kanazawa (JP)

(72) Inventors: Eiji Tanaka, Kanazawa (JP); Hiroyuki Yasuyoshi, Kanazawa (JP)

(73) Assignee: SHIBUYA KOGYO CO., LTD., Kanazawa-shi, Ishikawa (JP)

( * ) Notice: Subject to any disclaimer, the term of this patent is extended or adjusted under 35 U.S.C. 154(b) by 658 days.

(21) Appl. No.: 13/908,407

(22) Filed: Jun. 3, 2013

(65) Prior Publication Data

US 2014/0001162 A1    Jan. 2, 2014

(30) Foreign Application Priority Data

Jun. 28, 2012  (JP) ................. 2012-145862

(51) Int. Cl.
*B23K 26/00* (2014.01)
*H01L 21/20* (2006.01)
(Continued)

(52) U.S. Cl.
CPC ........... *B23K 26/0066* (2013.01); *H01L 24/75* (2013.01); *B23K 26/067* (2013.01); *H01L 21/2026* (2013.01); *H01L 24/13* (2013.01); *H01L 24/16* (2013.01); *H01L 24/81* (2013.01); *H01L 2224/16225* (2013.01); *H01L 2224/759* (2013.01); *H01L 2224/75252* (2013.01); *H01L 2224/75301* (2013.01); *H01L 2224/75502* (2013.01); *H01L 2224/75702* (2013.01); *H01L 2224/75745* (2013.01);
(Continued)

(58) Field of Classification Search
CPC ............ B23K 26/0639; B23K 26/063; B23K 26/032; B23K 26/067; B23K 26/246; B23K 26/34; B23K 2201/42; B23K 2201/40; B23K 3/087; B23K 3/0676; B23K 1/018; H01L 21/2026; H01L 2924/01079; H05K 3/3436; B29C 65/16; B29C 65/34; B29C 65/06; B29C 66/1122
USPC ............ 219/121.6–121.66, 230; 228/179.1, 228/180.21, 180.22, 44.3, 44.7, 49.5; 156/272.8, 379.6–379.8, 580
See application file for complete search history.

(56) References Cited

U.S. PATENT DOCUMENTS

| | | | | |
|---|---|---|---|---|
| 4,894,509 A | * | 1/1990 | Chalco ................ | B23K 1/0056 219/121.6 |
| 4,906,812 A | * | 3/1990 | Nied .................... | B23K 1/0056 219/121.63 |
| 5,042,709 A | * | 8/1991 | Cina .................... | G02B 6/4224 228/105 |

(Continued)

FOREIGN PATENT DOCUMENTS

| | | |
|---|---|---|
| JP | 2009-182162 | 8/2009 |
| JP | 2010-129890 | 6/2010 |

*Primary Examiner* — Dana Ross
*Assistant Examiner* — Hemant Mathew
(74) *Attorney, Agent, or Firm* — Flynn, Thiel, Boutell & Tanis, P.C.

(57) ABSTRACT

A bonding head 6 is provided with a tool base 8 in a housing 6A and a laser for transmitting laser beam L is configured such that the laser beam L transmitted through this tool base 8 can heat an electronic component 3 and bond the same to a substrate 2. A surface of a heat-radiating member 15 is provided in contact with a surface of the tool base 8 on which the laser beam L impinges. This heat-radiating member 15 has a light transmittance for transmitting the laser beam L and also has a thermal conductivity higher than the thermal conductivity of the tool base 8. The tool base 8 is heated during bonding treatment, but heat transmitted to the tool base 8 rapidly escapes to the heat-radiating member 15 having a higher thermal conductivity.

3 Claims, 1 Drawing Sheet

(51) Int. Cl.
*B23K 26/067* (2006.01)
*H01L 23/00* (2006.01)
(52) U.S. Cl.
CPC ............ *H01L 2224/75824* (2013.01); *H01L 2224/81191* (2013.01); *H01L 2924/12042* (2013.01)

(56) References Cited

U.S. PATENT DOCUMENTS

| | | | |
|---|---|---|---|
| 5,565,119 A * | 10/1996 | Behun | B23K 26/064 219/121.6 |
| 8,168,920 B2 * | 5/2012 | Terada | B23K 1/0056 219/121.65 |
| 2003/0136523 A1 * | 7/2003 | Takahashi | B23K 20/10 156/580.1 |
| 2007/0037318 A1 * | 2/2007 | Kim | B23K 26/0643 438/106 |
| 2008/0268571 A1 * | 10/2008 | Kim | B23K 1/0056 438/108 |
| 2009/0071945 A1 * | 3/2009 | Terada | B23K 1/0056 219/121.63 |
| 2010/0219229 A1 * | 9/2010 | Fujita | H01L 24/75 228/110.1 |

\* cited by examiner

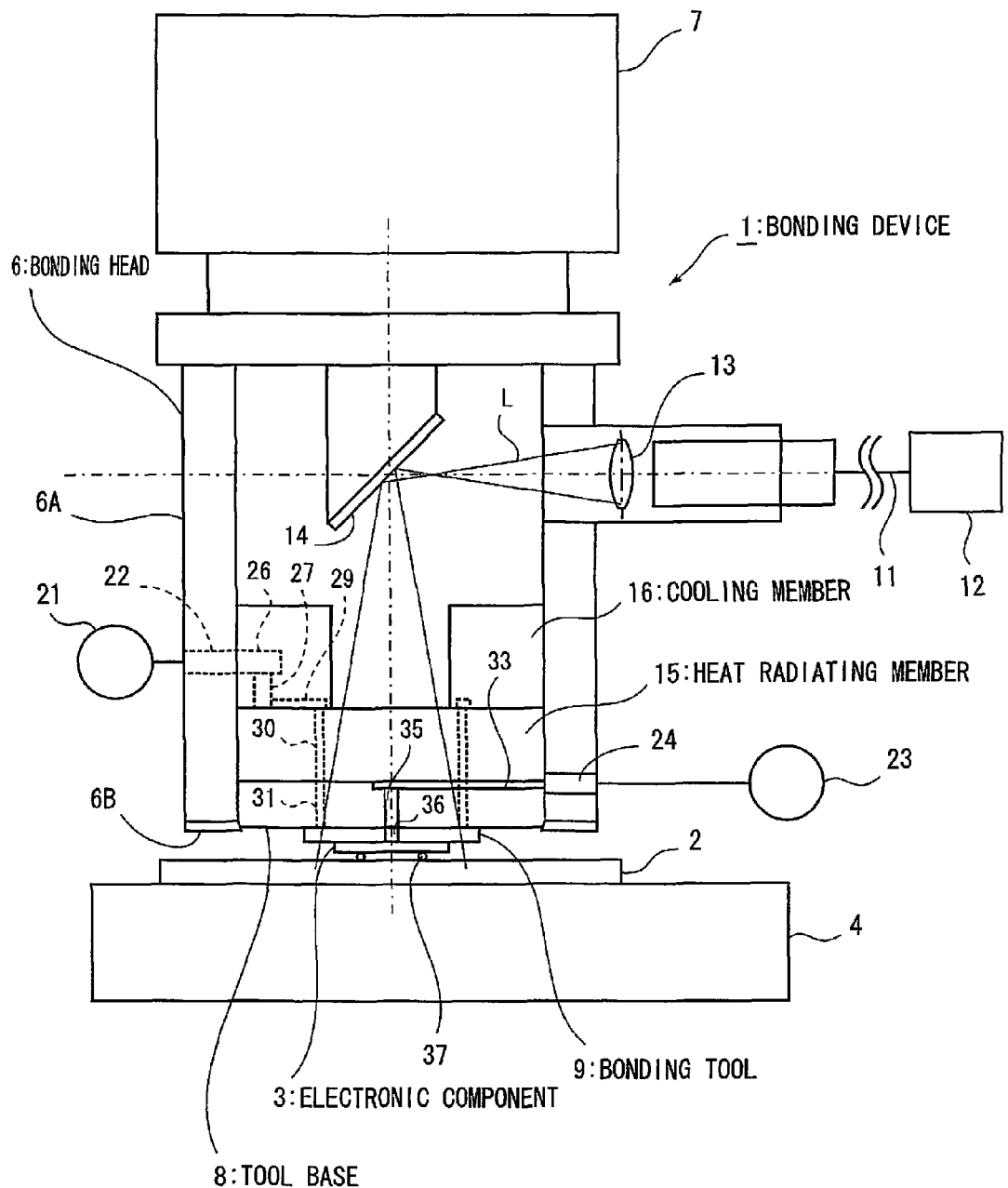

BONDING HEAD

FIELD OF THE INVENTION

The present invention relates to a bonding head and more particularly to a bonding head provided with a tool base in a housing and a transmitting laser beam and configured such that electronic components are heated and bonded to a substrate by the laser beam transmitted through this tool base.

DESCRIPTION OF THE PRIOR ART

As this type of bonding head, an electronic component is directly heated by a laser beam transmitted through a tool base has been known (Japanese Unexamined Patent Application Publication No. 2009-182162). This bonding head is used when the electronic component has a laser beam absorbency and durability, and the electronic component is directly held on a lower surface of the tool base and is heated by the laser beam transmitted through the tool base.

Moreover, such a bonding head is known that a bonding tool is heated by a laser beam transmitted through a tool base and the electronic component attracted and held by this bonding tool is heated (Japanese Unexamined Patent Application Publication No. 2010-129890). This bonding head is used when the electronic component does not have a laser beam absorbency and durability, and in this case, the bonding tool having a light absorbency is attached to the lower surface of the tool base so as to hold the electronic component on a lower surface of the bonding tool.

The tool bases in the bonding heads in the above-described Japanese Unexamined Patent Application Publication No. 2009-182162 and Japanese Unexamined Patent Application Publication No. 2010-129890 are both made of quartz. Since quartz has a light transmittance, the temperature is not raised by the laser beam, and since its thermal conductivity is low, heat is not easily transmitted from the electronic component heated by the laser beam or the bonding tool, and the temperature of the component itself cannot be raised easily.

However, by applying a bonding treatment of bonding the electronic component to the substrate, heat from the heated electronic component or bonding tool is transmitted to the tool base, and thus, the temperature is raised.

When the subsequent electronic component is to be picked up after the electronic component is bonded to the substrate, the tool base should be at a predetermined temperature or lower, but since the quartz constituting the tool base has a low thermal conductivity as described above, once the temperature thereof is raised, the cooling of it takes a long time. Particularly in the bonding head using the bonding tool, even if the bonding tool is cooled, heat thus returns from the tool base to the bonding tool, and the reduction of the cooling time has been difficult.

Particularly in the bonding in which a thermosetting resin is used as an adhesive, when an electronic component is to be picked up, the temperature of the tool base needs to be lowered to approximately a room temperature at which the thermosetting resin is not hardened and thus, the reduction of the cooling time is an indispensable challenge for the reduction of the working time of a bonding device.

SUMMARY OF THE INVENTION

The present invention has been made in view of the above circumstances and has an object to provide a bonding head which can cool a tool base more rapidly.

That is, the present invention is characterized in that, in a bonding head comprising a tool base provided in a housing and a transmitting laser beam and configured to heat an electronic component by the laser beam transmitted through this tool base and to bond it to a substrate, a surface of a heat-radiating member is provided in contact with a surface of the tool base on which the laser beam impinges, this heat-radiating member has a light transmittance for transmitting the laser beam and has a thermal conductivity higher than that of the tool base.

As described above, the tool base is heated when the electronic component is to be bonded to the substrate and the temperature thereof is raised. However, in the present invention, the heat-radiating member is provided in contact with the surface of the tool base on which the laser beam impinges, and this heat-radiating member has a thermal conductivity higher than that of the tool base, and thus, heat escaping from the electronic component to the tool base and to be accumulated therein can escape rapidly to the heat-radiating member having the higher thermal conductivity.

Therefore, since the temperature rise of the tool base can be favorably prevented all the time, the reduction of the working time of the bonding device can be achieved.

BRIEF DESCRIPTION OF THE DRAWINGS

FIG. 1 is a configuration diagram illustrating an embodiment of the present invention.

DETAILED DESCRIPTION OF THE EMBODIMENTS

The present invention will be descried below with reference to an illustrated embodiment. In FIG. 1, reference numeral 1 denotes a bonding device for bonding an electronic component 3 to a substrate 2, and the bonding device 1 is provided with a substrate stage 4 for supporting the substrate 2 and sliding it in an X-Y direction in a horizontal plane. A bonding head 6 is arranged above the substrate stage 4, and this bonding head 6 is configured to be capable of being elevated up/down by a lifting and loading mechanism 7.

The bonding head 6 is provided with a housing 6A formed in a cylindrical shape, and a tool base 8 is horizontally fixed to a lower end portion of this housing 6A through a ring-shaped mounting member 6B so that a bonding tool 9 is detachably attracted and held on a lower surface of the tool base 8 as will be described later in detail and at the same time, the electronic component 3 can be detachably attracted and held on the lower surface of the bonding tool 9.

One end portion of a flexible optical fiber 11 is connected to an upper part of a side wall of the housing 6A in a horizontal direction, and the other end of this optical fiber 11 is connected to a laser resonator 12.

A laser beam L oscillated from the laser resonator 12 is projected horizontally from the one end portion to the center of the housing 6A through the optical fiber 11 and also collected by a condensing lens 13 to a required size.

Then, the laser beam L projected in the horizontal direction is reflected by a reflective mirror 14 provided at the center part on the upper side in the housing 6A downward in the vertical direction and is transmitted through a heat-radiating member 15 provided in lamination and in close contact on the surface of the tool base 8 on the side on which the laser beam L impinges and having a light transmittance and the tool base 8 and projected to the bonding tool 9 so as to be able to heat the bonding tool 9.

The heat-radiating member 15 has a thermal conductivity higher than that of the tool base 8, and a cooling member 16 having a thermal conductivity higher than that of the heat-radiating member 15 is provided in contact with an upper face of the heat-radiating member 15. This cooling member 16 is formed in a cylindrical shape so that the laser beam can pass through the center part thereof and thus, the cooling member 16 is arranged at the periphery of the heat-radiating member 15 in contact with the upper surface thereof. Moreover, an outer peripheral surface of the heat-radiating member 15 is brought into close contact with an inner peripheral surface of the housing 6A.

In this embodiment, the thickness of the tool base 8 is set to a small value and at the same time, the thickness of the heat-radiating member 15 is higher than the thickness of the tool base 8. As a result, the heat amount accumulated in the tool base 8 can be made as small as possible, and even if the thickness of the tool base 8 is set to a small value, its strength can be reinforced by the heat-radiating member 15.

As an example, the tool base 8 is formed of a thin plate-shaped quartz having a high strength and low thermal conductivity. The thermal conductivity of quartz is 1.5 W/m·K. As an example, the heat-radiating member 15 is formed of a thin plate-shaped sapphire having a high thermal conductivity. The thermal conductivity of sapphire is 40 W/m·K. Moreover, the cooling member 16 and the housing 6A are made of aluminum, and the thermal conductivity of aluminum is higher than that of sapphire and it is 236 W/m·K. The bonding tool 9 is constituted by a thin member made of silicon carbide, and the thermal conductivity of silicon carbide is 80 W/m·K.

As the material of the heat-radiating member 15, other than sapphire, diamond and ruby having a laser transmittance and high thermal conductivity can be used. Moreover, as the cooling member 16 and the housing 6A, a metal material having a high thermal conductivity can be used other than aluminum. It is particularly preferable that inside this cooling member 16 and the housing 6A, a cooling passage through which cooling water is made to flow is provided, for example, so that at least either one of the cooling member 16 and the housing 6A is cooled.

Operations of the substrate stage 4, the laser resonator 12, and the lifting and loading mechanism 7 are configured to be controlled by a controller, not shown, and it is configured such that the laser beam L is projected to the bonding tool 9 so as to heat the same by operating the laser resonator 12 by this controller.

As the laser resonator 12, a solid laser such as a semiconductor laser, a YAG laser and the like or other lasers can be used.

In the housing 6A, a tool attracting vacuum port 22 connected to vacuum source 21 and a tip attracting vacuum port 24 connected to vacuum source 23 are provided, and it is configured such that the bonding tool 9 can be attracted and held on the lower surface of the tool base 8 by suction from the tool attracting vacuum port 22 and the electronic component 3 can be attracted and held on the lower surface of the bonding tool 9 by suction from the tip attracting vacuum port 24.

The tool attracting vacuum port 22 is in communication with tool attracting holes 30 and 31 formed through the heat-radiating member 15 and the tool base 8, respectively, through a communication hole 26 in a radial direction and a communication hole 27 in a vertical direction formed in the cooling member 16 and a communication groove 29 formed in a lower surface of the cooling member 16.

These tool attracting holes 30 and 31 are formed at positions overlapping the bonding tool 9, and thus, it is configured such that the bonding tool 9 can be attracted and held on the lower surface of the tool base 8 by introducing a negative pressure in the tool attracting holes 30 and 31.

On the other hand, the tip attracting vacuum port 24 is in communication with tip attracting holes 35 and 36 formed through the tool base 8 and the bonding tool 9, respectively, through a communication groove 33 in a horizontal direction formed in the upper surface of the tool base 8.

Then, it is configured such that the electronic component 3 can be attracted and held on the lower surface of the bonding tool 9 by introducing a negative pressure to the tip attracting holes 35 and 36.

The tool attracting vacuum port 22 is active all the time so that the bonding tool 9 does not drop from the tool base 8. On the other hand, the tip attracting vacuum port 24 is active when the electronic component 3 is attracted and held.

In the above configuration, in a state where the electronic component 3 is attracted and held on the lower surface of the bonding tool 9, if the laser beam L is transmitted through the heat-radiating member 15 and the tool base 8 is projected to the bonding tool 9, the bonding tool 9 is heated by the laser beam L and the electronic component 3 and bumps 37 arranged at plural spots on the lower surface thereof are heated.

The controller is configured to start the lowering of the bonding head 6 by the lifting and loading mechanism 7 in a state the substrate stage 4 is operated and the electronic component 3 held by the bonding tool 9 and the substrate 2 are positioned. In a state where the bonding head 6 is lowered to a predetermined height so that the electronic component 3 and the substrate 2 are brought into contact and a required bonding load is applied, by oscillating the laser beam L from the laser resonator 12 and by projecting it to the bonding tool 9, the electronic component 3 attracted and held by the bonding tool 9 is pressed to the substrate 2 while being heated and bonded to the substrate 2.

When the bonding work is completed as above, since suctioning from the tip attracting holes 35 and 36 is stopped by an instruction from the controller, the holding state of the electronic component 3 by the bonding tool 9 is released, and then, the bonding head 6 is raised by the lifting and loading mechanism 7, and operation proceeds to the subsequent bonding.

When the bonding tool 9 is heated by the laser beam L, heat escapes from the heated bonding tool 9 to the tool base 8 in contact with the same, but since the thermal conductivity of the tool base 8 is set to a low value, the heat amount escaping from the bonding tool 9 to the tool base 8 can be suppressed. Therefore, as a result, the temperature of the bonding tool 9 can be rapidly raised to a required temperature.

When the bonding work is carried out, heat is transmitted from the bonding tool 9 to the tool base 8, whereby the temperature of the tool base 8 is raised. However, since the heat-radiating member 15 having a thermal conductivity higher than the thermal conductivity of the tool base 8 is in contact with the tool base 8, the heat to be accumulated in the tool base 8 rapidly escapes to the heat-radiating member 15. As a result, the temperature of the tool base 8 can be kept at a low temperature all the time.

Then, the heat having escaped to the heat-radiating member 15 further escapes to the outside through the cooling member 16 and the housing 6A.

When irradiation of the laser beam L to the bonding tool 9 is terminated, the bonding tool 9 is cooled, but at this time, heat returns to the bonding tool 9 from the tool base 8 whose temperature has been raised by the heat having escaped from the bonding tool 9 to the tool base 8 before that.

However, as described above, since the heat having escaped to the tool base 8 escapes to the heat-radiating member 15 side, the heat amount to return from the tool base 8 to the bonding tool 9 can be reduced far more than the prior-art case.

Therefore, as a result, rapid cooling of the bonding tool 9 is made possible. As described above, according to this embodiment, since the cooling efficiency of the bonding tool 9 can be improved, a reduction of the working time of the bonding device 1 can be achieved.

In the above embodiment, it is configured such that the bonding tool 9 is heated by the laser beam L and the electronic component 3 is heated by this heated bonding tool 9, but the bonding tool 9 may be omitted, and it may be configured such that the electronic component 3 is attracted and held by the tool base 8, and this electronic component 3 is directly heated by the laser beam L.

In this case, the introduction of the negative pressure from the tool attracting vacuum port 22 to the tool attracting holes 30 and 31 is stopped, and the bonding tool 9 having been attracted and held on the lower surface of the tool base 8 is removed, and moreover, it may be so configured such that the negative pressure is introduced from the tip attracting vacuum port 24 to the tip attracting hole 35 and the electronic component 3 is directly attracted and held on the lower surface of the tool base 8 by the tip attracting hole 35. That is, in this case, the tool base 8 acts as the bonding tool 9.

As described above, the bonding device 1 of the above-described embodiment can heat the electronic component 3 through the bonding tool 9 by the laser beam L transmitted through the tool base 8 or can directly heat the electronic component 3 attracted and held by the tool base 8, but it is needless to say that each can be constituted as an exclusive machine.

What is claimed is:

1. A bonding head comprising a tool base disposed at a lower portion of a housing and, a laser for transmitting a laser beam to heat an electronic component and bond the electronic component to a substrate, a heat-radiating member provided in contact with a surface of the tool base on which the laser beam impinges and having a light transmittance for transmitting the laser beam and a thermal conductivity greater than a thermal conductivity of the tool base and a cooling member having a thermal conductivity greater than the thermal conductivity of the heat-radiating member is provided in contact with the heat-radiating member and arranged at a periphery of the heat-radiating member so that the laser beam passes through a center part of the heat-radiating member.

2. The bonding head according to claim 1, wherein
   a thickness of the heat radiating member is larger than a thickness of the tool base.

3. The bonding head according to claim 1, wherein
   a bonding tool is arranged between the tool base and the electronic component, and the bonding tool is in contact with the tool base and the electronic component, respectively, and the laser beam transmitted through the tool base heats the bonding tool and the heated bonding tool heats the electronic component.

\* \* \* \* \*